(12) United States Patent
Zhuang et al.

(10) Patent No.: US 10,408,877 B2
(45) Date of Patent: Sep. 10, 2019

(54) METHOD AND DEVICE FOR MONITORING CIRCUIT BREAKER

(71) Applicant: ABB Schweiz AG, Baden (CH)

(72) Inventors: Zhijian Zhuang, Fujian (CN); Xin Ye, Fujian (CN); Congwen Lu, Fujian (CN)

(73) Assignee: ABB Schweiz AG, Baden (CH)

( * ) Notice: Subject to any disclaimer, the term of this patent is extended or adjusted under 35 U.S.C. 154(b) by 233 days.

(21) Appl. No.: 15/185,614

(22) Filed: Jun. 17, 2016

(65) Prior Publication Data

US 2016/0299192 A1 Oct. 13, 2016

Related U.S. Application Data

(63) Continuation of application No. PCT/CN2014/087840, filed on Sep. 29, 2014.

(51) Int. Cl.
*G01R 31/327* (2006.01)

(52) U.S. Cl.
CPC ....... *G01R 31/327* (2013.01); *G01R 31/3274* (2013.01)

(58) Field of Classification Search
CPC .......................... G01R 31/327; G01R 31/3274
See application file for complete search history.

(56) References Cited

U.S. PATENT DOCUMENTS

| | | |
|---|---|---|
| 4,433,293 A | 2/1984 | Aoyagi et al. |
| 6,023,404 A | 2/2000 | Marmonier |
| 6,236,548 B1 * | 5/2001 | Marmonier ............ H01H 33/26 361/102 |
| 6,963,203 B2 | 11/2005 | Stanisic et al. |

(Continued)

FOREIGN PATENT DOCUMENTS

| | | |
|---|---|---|
| CN | 1687801 A | 10/2005 |
| CN | 1950711 A | 4/2007 |

(Continued)

OTHER PUBLICATIONS

State Intellectual Property Office of the P.R. China, International Search Report & Written Opinion issued in corresponding Application No. PCT/CN2014/087840, dated Jun. 17, 2015, 10 pp.

(Continued)

*Primary Examiner* — Tung X Nguyen
*Assistant Examiner* — Dominic E Hawkins
(74) *Attorney, Agent, or Firm* — Taft Stettinius & Hollister LLP

(57) ABSTRACT

Embodiments of the present disclosure provide a method for monitoring a circuit breaker, comprising the following steps: obtaining a characteristic force associated with an actuating mechanism of the circuit breaker over the time; and determining the time point when the closing and/or opening of the circuit breaker occurs by identifying a variation of the force. The step of determining further comprises determining the moment when a variation increase of the characteristic force occurs as the time point of the closing of the circuit breaker; and determining the moment when a variation decrease of the characteristic force occurs as the time point of the opening of the circuit breaker. The method can be used to accurately on-line monitor the closing and opening time point of the circuit breaker.

16 Claims, 8 Drawing Sheets

(56) References Cited

U.S. PATENT DOCUMENTS

| | | | |
|---|---|---|---|
| 7,109,720 B2 | 9/2006 | Baurand et al. | |
| 2004/0264094 A1* | 12/2004 | Rahman | H02H 7/0455 361/115 |
| 2010/0254060 A1* | 10/2010 | Saito | H01H 9/56 361/115 |
| 2012/0022797 A1* | 1/2012 | Maruyama | G05B 23/0283 702/34 |
| 2012/0319692 A1 | 12/2012 | Lalonge et al. | |
| 2014/0130575 A1 | 5/2014 | Webber et al. | |
| 2014/0146433 A1* | 5/2014 | Uchiyama | H01H 3/26 361/115 |
| 2015/0235793 A1* | 8/2015 | Rakuff | H01H 3/222 335/169 |

FOREIGN PATENT DOCUMENTS

| | | |
|---|---|---|
| CN | 101226845 A | 7/2008 |
| CN | 101548351 A | 9/2009 |
| CN | 201576638 U | 9/2010 |
| CN | 102064057 A | 5/2011 |
| CN | 102269650 A | 12/2011 |
| CN | 10252268 A | 6/2012 |
| CN | 102592878 A | 7/2012 |
| CN | 103050323 A | 4/2013 |
| CN | 103155076 A | 6/2013 |
| CN | 103487748 A | 1/2014 |
| CN | 103675665 A | 3/2014 |
| CN | 203572932 U | 4/2014 |
| CN | 203630307 U | 6/2014 |
| CN | 203825161 U | 9/2014 |
| JP | 6161073 A | 3/1986 |
| RU | 2002126077 A | 3/2004 |
| RU | 2297065 C2 | 4/2007 |
| UA | 65664 C2 | 4/2004 |
| WO | 199323760 A1 | 11/1993 |
| WO | 2001067312 A2 | 9/2001 |

OTHER PUBLICATIONS

Extended European Search Report, European Patent Application No. 14902901.9, dated May 2, 2018, 10 pages.

Russian Office Action, Russian Patent Application No. 2016138633, dated May 8, 2018, 12 pages, including English translation.

A.A. Zharkikh, Image processing based on wavelet transformation in Haar basis over Galois field of the odd characteristic, Vestnik of MSTU, vol. 12, No. 2, 2009, pp. 197-201. English translation of Abstract on first page of document.

Chinese Office Action, Chinese Patent Application No. 201480077674. X, dated Sep. 10, 2018, 18 pages including English translation.

Chinese Search Report, Chinese Patent Application No. 201480077674. X, dated Sep. 10, 2018, 6 pages including English translation.

Russian Decision to Grant, Russian Patent Application No. 2016138633/28, dated Jul. 26, 2018, 17 pages including English translation.

Chinese Office Action, Chinese Patent Application No. 201480077674. X, May 15, 2019, 18 pages including machine translation in English.

Chinese Search Report, Chinese Patent Application No. 201480077674X, May 15, 2019, 4 pages including machine translation in English.

* cited by examiner

METHOD AND DEVICE FOR MONITORING CIRCUIT BREAKER

FIELD OF INVENTION

Embodiments of the present disclosure relate to the field of a circuit breaker, and in particular to on-line monitoring the mechanical characteristics of a circuit breaker.

BACKGROUND ART

In recent several years, more and more experts pay much attention to research and development on mechanical characteristic monitoring of a circuit breaker. The dynamic characteristics of a circuit breaker can reflect the running failure of the circuit breaker effectively. Therefore, the mechanical characteristic is considered as one of the most important features for a circuit breaker, and there is a requirement to monitor the mechanical characteristic of a circuit breaker.

Currently, mechanical characteristic monitoring of a circuit breaker is usually taken in an off-line environment by means of electronic sensors. The off-line environment may be a testing environment in which the circuit breaker is not electrically connected to the grid and thus would not subject the high voltage in the grid. The voltage for testing in the testing environment is relative low such that it would not impact the normal operation of the electronic sensors. However, since the circuit contact in off-line or testing environment does not subject the real high voltage, the monitored result can not accurately reflect the practical operation condition of the circuit breaker and thus can only act as a limited reference for studying the circuit breaker.

As the smart grid technology develops, there is a demand for intelligent circuit breakers which can on-line monitor the mechanical characteristic of the circuit breakers in their normal operation condition so as to support the functions of the smart grid. On-line monitoring can reflect the real operation condition of the circuit breaker, and thus is more useful in studying and controlling the circuit breaker.

An accurate monitoring to the mechanical character of a circuit breaker depends on the finding of the accurate closing and opening time point of the circuit breaker. Once the closing and opening time point is obtained, other mechanical characters of the circuit breaker, such as the contact opening gap, the contact spring stroke and the closing and opening speed can also be obtained based on the closing and opening time point in a known way.

However, the current off-line monitoring method is not suitable for on-line monitoring. The high voltage of the grid in the on-line environment can easily damage the electronics for the off-line monitoring.

In addition, since the electrical closing and opening time point under the high voltage cannot represent the real mechanical closing and opening of the movable contact due to the breakdown conducting under high voltage, it is necessary to find the mechanical closing and opening time point of the movable contact in the operation condition of the circuit breaker so as to accurately monitoring the mechanical characters of the circuit breaker. However, it is difficult to directly monitor the accurate mechanical closing and opening time point of a circuit breaker under the high voltage.

Therefore, a method for on-line monitoring the mechanical characteristic of a circuit breaker, particularly for on-line monitoring the accurate mechanical closing and opening time point is required.

SUMMARY OF INVENTION

Hence, in order to overcome one or more of the deficiencies in the prior art mentioned above, one of objectives of embodiments of the present disclosure is to provide a method and device for on-line monitoring a mechanical characteristic of a circuit breaker.

According to one aspect of the embodiments of the present disclosure, there is provided a method for monitoring a circuit breaker. The circuit breaker comprises an actuating mechanism for actuating the closing and opening of a movable contact of the circuit breaker. The method comprises the following steps: obtaining a characteristic force associated with the actuating mechanism over the time; and determining the time point when the closing and/or opening of the circuit breaker occurs by identifying a variation of the force. The step of determining further comprises determining the moment when a variation increase of the characteristic force occurs as the time point of the closing of the circuit breaker; and determining the moment when a variation decrease of the characteristic force occurs as the time point of the opening of the circuit breaker.

Since the accurate time point of closing or opening of the circuit breaker can be determined by sensing the characteristic forces, the sensing electronics and the sensing process would not be impacted by the severe environment, such as high voltage, complex magnetic field and arc discharge, near the movable contact. As a result, the monitoring to the time point of closing or opening of the circuit breaker can be taken during the normal operation of the circuit breaker.

According to one aspect of the embodiments of the present disclosure, the characteristic force is at least one of the followings:

- a contact force which is directly applied on a linkage mechanism of the actuating mechanism by a movable contact of the circuit breaker;
- an internal force subjected by any rod of a linkage mechanism of a actuating mechanism;
- a resultant force subjected by either end of any rod of the linkage mechanism;
- a component of the resultant force subjected by either end of any rod of the linkage mechanism, which component is in the direction of the contact force;
- a component of the resultant force subjected by either end of any rod of the linkage mechanism, which component is perpendicular to the direction of the contact force;
- a resultant force subjected by any pivot point for the linkage mechanism;
- a component of the resultant force subjected by any pivot point for the linkage mechanism, which component is in the direction of the contact force;
- a component of the resultant force subjected by any pivot point for the linkage mechanism, which component is perpendicular to the direction of the contact force.

According to one aspect of the embodiments of the present disclosure, the step of obtaining comprises computing a contact force which is directly applied on a linkage mechanism of the actuating mechanism by a movable contact of the circuit breaker, by a sensed force associated with the actuating mechanism. The determining step comprises determining the time point when the closing and/or opening of the circuit breaker occurs by identifying a variation of the computed contact force. The contact force may be computed by the sensed force which is sensed at any pivot point of the linkage mechanism.

According to one aspect of the embodiments of the present disclosure, the variation of the force is identified based on the magnitude of the force and/or the rate of force variation.

According to one aspect of the embodiments of the present disclosure, the step of obtaining comprises sampling a number of values of the characteristic force at different time points from a starting point, and obtaining an first array F $[a_1, a_2, \ldots a_i, \ldots a_n]$ representing the values of the characteristic force at the sampling time points, and a second array T $[t_1, t_2, \ldots t_i, \ldots t_n]$ representing the corresponding sampling time points, wherein "$a_i$" is the value of the sampled characteristic force for the i time sampling, "n" is the number of the sampling, "$t_i$" is the time point for the i time sampling.

According to one aspect of the embodiments of the present disclosure, the determining step comprising identifying an item from the first item in the first array F which is value reaches or exceeds a first predetermined force value for the first time, and determining the time point in the second array T corresponding to the identified item from the first array F as the time point of the closing of the circuit breaker.

According to one aspect of the embodiments of the present disclosure, the determining step comprising identifying an item from the first item in the first array F which value is at or below a second predetermined force value for the first time, and determining the time point in the second array T corresponding to the identified item from the first array F as the time point of the opening of the circuit breaker.

According to one aspect of the embodiments of the present disclosure, the determining step comprising identifying an item from the first item in the first array F which meets the following condition for the first time: there are just a predetermined number of continuous items from a preceding item to the identified item in the first array F, wherein each of the continuous items has a value at or below a second predetermined force value; and then determining the time point in the second array T corresponding to the first item of the predetermined number of continuous items in the first array F as the time point of the opening of the circuit breaker.

According to one aspect of the embodiments of the present disclosure, the step of obtaining further comprises computing and obtaining a third array dF $[(a_2-a_1)/(t_2-t_1), (a_3-a_2)/(t_3-t_2), \ldots (a_i-a_{i-1})/(t_i-t_{i-1}), \ldots (a_n-a_{n-1})/(t_n-t_{n-1})]$ representing the rate of force variation, in which each item refers to the force change rate during the adjacent two samplings.

According to one aspect of the embodiments of the present disclosure, the determining step comprises: identifying an item from the first item in the first array F which meets the following both conditions for the first time:
the value of the identified item reaches or exceeds a first predetermined force value;
among the several items in the third array dF which are at or close to a corresponding item in the third array dF, there is an item which value reaches or exceeds a first predetermined force change rate value, wherein the corresponding item in the third array dF refers to the force change rate at the time point when the identified item in the first array F is sampled;
and then determining the time point in the second array T corresponding to the identified item from the first array F as the time point of the closing of the circuit breaker.

According to one aspect of the embodiments of the present disclosure, the determining step comprises: identifying an item from the first item in the first array F which meets the following both conditions for the first time:
the value of the identified item is at or below a second predetermined force value;
among the several items in the third array dF which are at or close to a corresponding item in the third array dF, there is an item which absolute value reaches or exceeds a second predetermined force change rate value, wherein the corresponding item in the third array dF refers to the force change rate at the time point when the identified item in the first array F is sampled;
and then determining the time point in the second array T corresponding to the identified item from the first array F as the time point of the opening of the circuit breaker.

According to one aspect of the embodiments of the present disclosure, the step of obtaining comprises obtaining a profile of the value of the characteristic force over the time; and the step of determining comprises determining the time point when the closing and/or opening of the circuit breaker occurs by identifying a variation in the profile.

According to one aspect of the embodiments of the present disclosure, the step of determining comprises processing the profile with wavelet transforming, and determining the time point when the closing and/or opening of the circuit breaker occurs by identifying a variation in the processed profile.

According to one aspect of the embodiments of the present disclosure, the wavelet transforming is based on the Haar function.

According to one aspect of the embodiments of the present disclosure, a device for monitoring a circuit breaker is further provided. The circuit breaker comprises an actuating mechanism for actuating the closing and opening of a movable contact of the circuit breaker. The device comprises: means for obtaining a characteristic force associated with the actuating mechanism over the time; and means for determining the time point when the closing and/or opening of the circuit breaker occurs by identifying a variation of the force. The means for determining is further configured to determine the moment when a variation increase of the characteristic force occurs as the time point of the closing of the circuit breaker, and determine the moment when a variation decrease of the characteristic force occurs as the time point of the opening of the circuit breaker.

BRIEF DESCRIPTION OF THE DRAWINGS

When reading the following detailed description on the exemplary embodiments with reference to the drawings, the aim, features and advantages of the present disclosure become obvious, wherein.

DETAILED DESCRIPTION OF EMBODIMENTS

Figure 1:
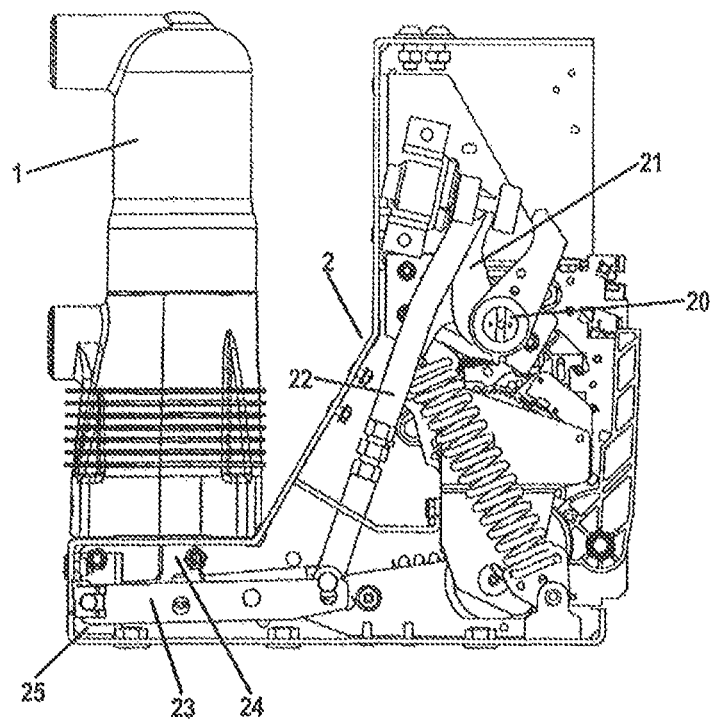
FIG. 1 illustrates an exemplary circuit breaker which can be on-line monitored by the method according to an embodiment of the present invention.

Hereinafter, exemplary embodiments will be referred to in describing the mechanism and spirit of the present disclosure. It should be understood that these embodiments are merely provided to facilitate those skilled in the art in understanding and in turn implementing the present disclosure, but not for limiting the scope of the present disclosure in any way.

Various embodiments of the present disclosure are described in detail herein in an exemplary way by referring to the drawings.

FIG. 1 illustrates an exemplary circuit breaker which can be on-line monitored by the method according to an embodiment of the present invention. The circuit breaker as shown in FIG. 1 is a high voltage circuit breaker, comprising a stationary contact and a movable contact (not shown) enclosed in an insulation sleeve 1, and an actuating mechanism 2 for actuating the closing and opening action of the movable contact. The actuating mechanism 2 is usually a linkage mechanism for transmitting a driving force from an active element for example, a motor or a spring actuator, to the movable contact. As shown in FIG. 1, the linkage mechanism comprises a first lever 21, a second level 22, a third lever 23 pivotally connected to each other in sequence. The first lever 21 is connected to a driving shaft 20 driven by an active element, and the third lever 23 is pivotally connected to a support 25 on the base of the circuit breaker. A push rod 24 on one end is pivotally connected to the movable contact at a distance from the pivot point between the third level 23 and the support 25. The other end of the push rod 24 is connected to the movable contact in the insulation sleeve 1. By driving the driving shaft 20 rotating via a motor or a spring, the movable contact can be moved up and down in a longitudinal direction in the sleeve 1 by the force transmission from the first lever 21, the second level 22, the third lever 23 and the push rod 24, so as to contact or be separated from the stationary contact and thus close or open the circuit.

As there is a severe environment inside the insulation sleeve 1 involving high voltage, high magnetic field and pre-arcing between the contacts, it is not practical to arrange electronic sensors near the contacts to sensor the parameter of the contacts for determining the time point when the movable contact is just closing or opening during closing or opening operation. The bounce of the movable contact during the closing and opening period further aggravate the difficulty of determining the definite time point of closing or opening of the movable contact based on any possible sensored data. The present invention is based on the insight that a significant force variation would occur as a transient on the movable contact and the driving mechanism during the closing and opening of the circuit breaker due to the change of the reaction of the stationary contact to the movable contact.

Figure 2:
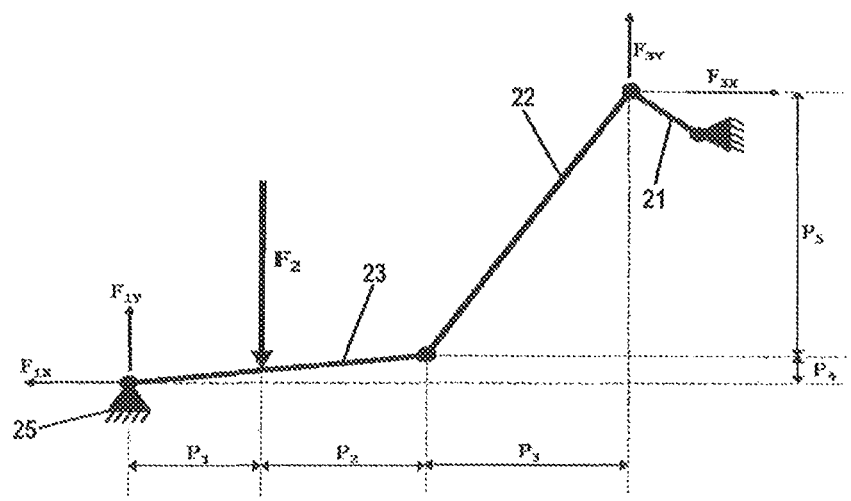
FIG. 2 illustrates the force applied on the linkage mechanism of the circuit breaker as shown in FIG. 1.

FIG. 2 illustrates the force applied on the linkage mechanism of the circuit breaker as shown in FIG. 1. In a balanced closed state of the circuit breaker, the movable contact abuts against the stationary contact under a force from the linkage mechanism. In this case, the stationary contact would apply a counter force $F_2$ (also referred to as contact force) on the movable contact which is in turn conducted to the third lever 23 through the push rod 24. Once the movable contact is separated from the stationary contact in the opening period, the counter force $F_2$ on the movable contact, the push rod 24 and the third lever 23 would decrease dramatically and even become zero. Likewise, during the closing period of the circuit breaker, the counter force $F_2$ applied on the movable contact by the stationary contact would dramatically from zero to a relative high value. It appears that the variation of the counter force $F_2$ applied on the push rod 24 or third lever 23 can act as a characteristic to reflect the closing and opening process of the circuit breaker. Furthermore, it can be reasonably supposed that at the time point when the movable contact just begins to contact the stationary contact, the first transient increase of the value of the counter force $F_2$ in the closing period would occur for the first time; and at the time point when the movable contact just begins to be separated from the stationary contact, the first transient decrease of the value of the counter force $F_2$ in the opening period would occur for the first time.

Based on the above observations, it is advantageous to determine the time point of closing and opening for the circuit breaker by identifying the variation of the counter force $F_2$.

Figure 3:
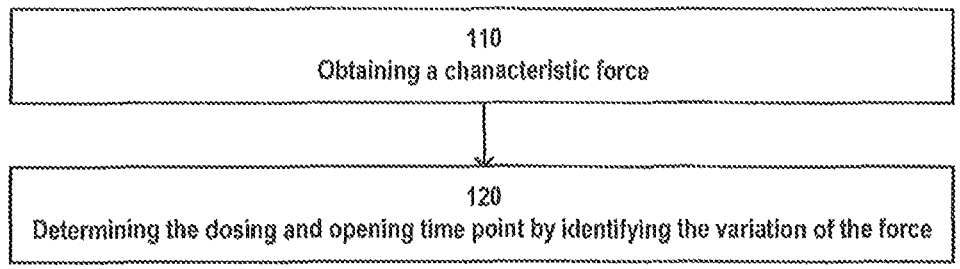
FIG. 3 illustrates the flow chart of a method for monitoring the circuit breaker according to the principle of the present invention.

With reference to FIG. 3, according to an embodiment of the present invention, a method for monitoring a circuit breaker is provided. The method comprises the following steps: obtaining (110) a characteristic force associated with the actuating mechanism (in this embodiment, the contact force which is directly applied on a linkage mechanism of the actuating mechanism by a movable contact of the circuit breaker); and determining (120) the time point when the closing and/or opening of the circuit breaker occurs by identifying a variation of the force. In particular, when a variation increase of the characteristic force occurs, the corresponding time point is determined as the time point of the closing of the circuit breaker; and when a variation decrease of the characteristic force occurs, the corresponding time point is determined as the time point of the opening of the circuit breaker.

The contact force or counter force $F_2$ can be sensored in different positions. For example, the contact force $F_2$ can be sensored on the push rod 24 by a force sensor disposed on the push rod 24. The force sensor can be a strain gauge connected to a measuring circuit, such as a strain foil, which can sensor the strain on the position where the strain foil is disposed by means of the variation in resistance of the foil due the strain. In order to amplify the strain on the push rod 24 for facilitating the measuring, some elastic structures can be provided on the push rod 24 where the strain gauge is attached, such as some slots. These elastic structures improve the deformation rate of the push rod 24 where the strain gauge is attached, such that the strain due to the contact force $F_2$ can be amplified and thus is easier to be accurately sensored. With the measuring circuit connected to the strain gauge, the contact force $F_2$ can be computed based on the sensored strain and the known deformation rate.

In an embodiment, the contact force $F_2$ can also be sensored on a position on the third lever 23 where the push rod 24 is connected to the third lever 23, or on the pivot shaft connecting the push rod 24 and the third lever 23. These positions are all isolated and away from the movable contact such that the sensoring would not be significantly impacted by the severe environment in the isolating sleeve 1, and the sensoring means is prevented from suffering and being damaged by the severe environment.

Further referring to FIG. 2, in the balanced closed state, the linkage mechanism also subjects other forces, such as the counter force from the external support structures and the interacting force from the adjacent levers. For example, taking the second lever 22 and the third lever 23 as a system, in addition to the contact force $F_2$, this system further subjects the following forces: the end of the third lever 23 connected to the support 25 subjects the counter force $F_1$ from the support 25 which can be divided into a component $F_{1x}$ perpendicular to the direction of the contact force $F_2$ and a component $F_{1y}$ in the direction of the contact force $F_2$; the end of the second lever 22 connected to the first lever 21 subjects the acting force $F_3$ from the first lever 21 which can be divided into a component $F_{3x}$ perpendicular to the direction of the contact force $F_2$ and a component $F_{3y}$ in the direction of the contact force $F_2$. In the balanced closed state, the system comprising the second lever 22 and the third lever 23 should meet the following three balance conditions so as to be kept in the static balance state: the resultant force in a X direction (the direction perpendicular to the contact force $F_2$) subjected by the system is equal to zero; the resultant force in a Y direction (the direction of the contact force $F_2$) subjected by the system is equal to zero; and the resultant torque subjected by each lever in the system is equal to zero.

Based on the above three conditions, the following four equations can be obtained:

$$F_{1x} = F_{3x};$$

$$F_{1y} + F_{3y} = F_2;$$

$$F_{3y} \cdot P_3 = F_{3x} \cdot P_5;$$

$$F_2 \cdot P_1 + F_{3x} \cdot P_4 = F_{3y} \cdot (P_1 + P_2).$$

wherein: the parameters $P_1$, $P_2$, $P_3$, $P_4$ and $P_5$ refer to the distances as marked in FIG. 2.

After transforming the above equations, obtaining:

$$F_{1x} = F2 \cdot \frac{P_1}{\left(P_1 + P_2 - \frac{P_3 P_4}{P_5}\right)} \cdot \frac{P_3}{P_5} \quad (1)$$

$$F_{1y} = F_2 \cdot \left(1 - \frac{P_1}{\left(P_1 + P_2 - \frac{P_3 P_4}{P_5}\right)}\right) \quad (2)$$

$$F_{3x} = F_2 \cdot \frac{P_1}{\left(P_1 + P_2 - \frac{P_3 P_4}{P_5}\right)} \cdot \frac{P_3}{P_5} \quad (3)$$

$$F_{3y} = F_2 \cdot \frac{P_1}{\left(P_1 + P_2 - \frac{P_3 P_4}{P_5}\right)} \quad (4)$$

From the above results (1)-(4), it appears that supposing all the distances $P_1$-$P_5$ are constant, the forces $F_{1x}$, $F_{1y}$, $F_{3x}$ and $F_{3y}$ are all linearly relevant to the contact force $F_2$. Considering the rather small change in the distances $P_1$-$P_5$ during the very small movement of the movable contact in a short closing or opening period in which the movable contact is nearly contacting or leaving the stationary contact, the forces $F_{1x}$, $F_{1y}$, $F_{3x}$ and $F_{3y}$ can be considered as approximately linearly relevant to the contact force $F_2$ during the period in which the movable contact is nearly contacting or leaving the stationary contact. In this case, the change in the forces $F_{1x}$, $F_{1y}$, $F_{3x}$ and $F_{3y}$ can also be used to reflect the change in the contact force $F_2$ and thus reflect the closing and opening process of the circuit breaker.

In an embodiment, by obtaining any of the forces $F_{1x}$, $F_{1y}$, $F_{3x}$ and $F_{3y}$, and taking any of the forces $F_{1x}$, $F_{1y}$, $F_{3x}$ and $F_{3y}$ as the characteristic force, and identifying a variation of any of the forces $F_{1x}$, $F_{1y}$, $F_{3x}$ and $F_{3y}$, the time point of closing and opening of the circuit breaker can also be determined.

In an embodiment, it is also possible to further measure the distances $P_1$-$P_5$ in the balanced closed state of the movable contact, and compute the contact force $F_2$ with any of the sensored forces $F_{1x}$, $F_{1y}$, $F_{3x}$ and $F_{3y}$, and the distances $P_1$-$P_5$ by means of the above results (1)-(4). After that, the computed contact force $F_2$ can further be used as the characteristic force to determine the time point of closing and opening of the circuit breaker as described before.

In fact, the whole linkage mechanism or any other possible actuating mechanism of a circuit breaker would be affected by the contact force $F_2$. Any force applied on the linkage mechanism or by the linkage mechanism would change in response to the change in the contact force $F_2$. Therefore, in theory, any force associated with the linkage mechanism can used as a characteristic force to be directly sensored and used to determine the closing and opening time point. The force which can be used as the characteristic force at least comprises:

the contact force F2;
an internal force subjected by any rod of a linkage mechanism of a actuating mechanism;
a resultant force subjected by either end of any rod of the linkage mechanism;
a component of the resultant force subjected by either end of any rod of the linkage mechanism, which component is in the direction of the contact force;
a component of the resultant force subjected by either end of any rod of the linkage mechanism, which component is perpendicular to the direction of the contact force;
a resultant force subjected by any pivot point for the linkage mechanism;
a component of the resultant force subjected by any pivot point for the linkage mechanism, which component is in the direction of the contact force;
a component of the resultant force subjected by any pivot point for the linkage mechanism, which component is perpendicular to the direction of the contact force.

In order to sensor the force applied on the linkage mechanism or by the linkage mechanism, the strain gauge should be attached to the corresponding positions. For example, the strain gauge can be attached on any lever along the longitudinal direction of the lever to sensor the internal stress on the lever; the strain gauge can be attached on the end of any lever to sensor the force (X component, Y component or the resultant force) applied on the end of the lever by other connected part. It is advantageous to attach the strain gauge on any pivot point (such as the support 25) to sensor the force applied by the linkage mechanism which has the same value as the force applied on the linkage mechanism in the same point and can also be used to determine the closing and opening time point. Since the strain gauge is attached to a stationary structure (the pivot point), the strain gauge would not be moved, such that the strain gauge can be attached more firmly, and the sensoring precision would be higher without the impact of the movement of the strain gauge. In order to amplify the strain so as to improve the sensoring precision, it is also possible to provide elastic structures as mentioned before on any position where the strain gauge is attached, including on any lever and on any pivot point.

In order to accurately reflect the change in the contact force $F_2$, the other forces acting as the characteristic forces should has a high linearity and sensitivity with respect to the counter force $F_2$. Normally, the force in the direction of the counter force $F_2$ would have more linearity and sensitivity with respect to the counter force $F_2$ compared to the forces in other directions. For the linkage mechanism as shown in FIG. 2, the Y component $F_{1y}$ of the counter force $F_1$ and the Y component of the acting force $F_3$ are in the direction of the counter force $F_2$, and have high linearity and sensitivity with respect to the counter force $F_2$. Therefore, it is advantageous to directly sensor the force $F_{1y}$ or $F_{3y}$ as the characteristic force to determine the time point of closing and opening. Experiment result shows the force $F_{1y}$ has higher linearity and sensitivity compared to $F_{3y}$. In this regard, it is further advantageous to attach the strain gauge on the support 25 to sensor $F_{1y}$ as the characteristic force.

It is also possible to compute the contact force $F_2$ with the any sensored force as mentioned above, and take the computed contact force $F_2$ as the characteristic force. In order to compute the contact force $F_2$, a suitable system to be discussed should be selected from the linkage mechanism or other actuating mechanism. The system may comprise more than two levers. It is necessary to ensure that based on the force balance and torque balance conditions, the equations as mentioned above can be created and all the forces in the equations (including the counter force $F_2$) can be solved based on the equations.

Various specific embodiments for monitoring the closing and opening time point will be described in the followings.

Figure 4:
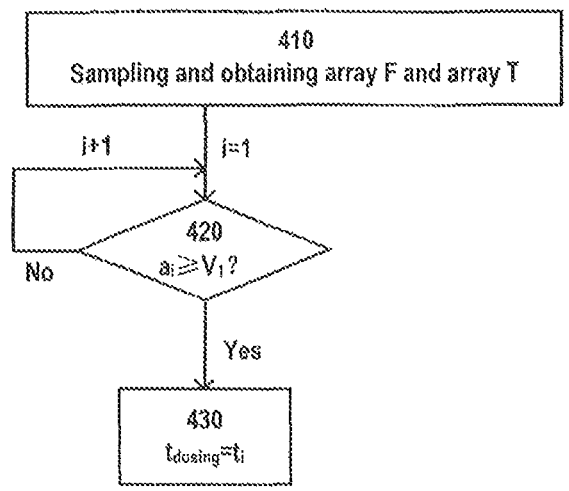
FIG. 4 illustrates the flow chart of a method for monitoring the time point of closing of a circuit breaker according to an embodiment of the present invention.

FIG. 4 illustrates the flow chart of a method for monitoring the time point of closing of a circuit breaker according to an embodiment of the present invention. Firstly, sampling 410 a number of values of the characteristic force (such as the contact force $F_2$ either sensored directly or computed from the other sensored forces, or other sensored characteristic forces) at different time points from a starting point, and thus obtaining 410 an first array F [$a_1, a_2, \ldots a_i, \ldots a_n$] representing the values of the characteristic force at the sampling time points, and a second array T [$t_1, t_2, \ldots t_i, \ldots t_n$] representing the corresponding sampling time points, wherein "$a_i$" is the value of the sampled characteristic force for the i time sampling, "n" is the number of the sampling, "$t_i$" is the time point for the i time sampling.

The starting point is usually the time point when the closing instruction is sent from a control circuit. The sampling interval or frequency depends on the precision requirement for the closing and opening time point. For example, the sampling interval can be set as 1.33 µs. The closing or opening process may last for 100 ms since sending the instruction. As a result, according to the sampling interval of 1.33 µs, the number "n" of sampling is 752 during the whole closing or opening period.

Then, comparing 420 $a_i$ in the first array F with a first predetermined force value V1 from the first item $a_1$ in the array F. The first predetermined force value V1 is set according to the specific structure of the circuit breaker and the selected characteristic force. The first predetermined force value V1 should be set large enough to be distinguished from the noise before the actual contact between the stationary and the movable contacts, but no larger than the actual contact force therebetween on the beginning of the closing. If taking the contact force $F_2$ as the characteristic force, the first predetermined force value V1 can be set between 500N-6000N.

If the value of the first item a does not reach or exceed the first predetermined force value V1, circulating the comparison step 420 for the next item $a_i$ in the first array F, until identifying the item $a_i$ in the first array F for the first time which value reaches or exceeds the first predetermined force value V1. Then determining 420 the time point $t_i$ in the second array T corresponding to the identified item a; from the first array F as the time point $t_{closing}$ of the closing of the circuit breaker. The first large magnitude variation of the characteristic force since the starting point can reflect the first contact between the movable and stationary contacts. As such, the closing time point is found.

Figure 5:
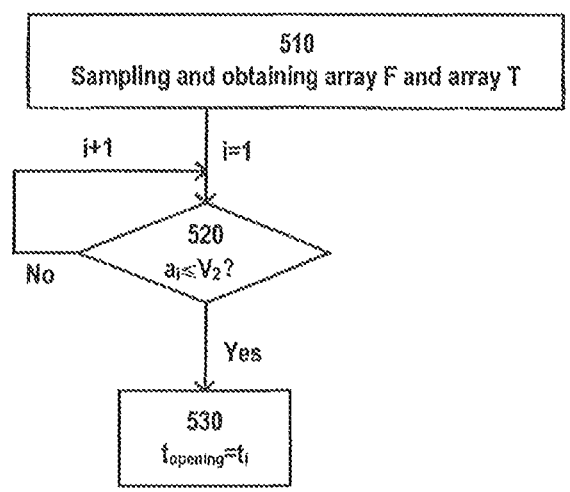
FIG. 5 illustrates the flow chart of a method for monitoring the time point of opening of a circuit breaker according to an embodiment of the present invention.

FIG. 5 illustrates the flow chart of a method for monitoring the time point of opening of a circuit breaker according to an embodiment of the present invention. In this method, the step 510 of sampling values of the characteristic force and obtaining array an first array F [$a_1, a_2, \ldots a_i, \ldots a_n$] and a second array T [$t_1, t_2, \ldots t_i, \ldots t_n$] is taken in the same way as the sampling and obtaining step 410 in the closing monitoring method as illustrated in FIG. 4. The mere difference is the starting point for sampling in step 510 is usually the time point when the opening instruction is sent from a control circuit. The comparison step 520 and circulating the step 520 is similar to the comparison and circulating step 420 in FIG. 4. The mere difference is the condition for judging is instead that whether the value of $a_i$ is at or below a second predetermined force value V2.

The second predetermined force value V2 should be set small enough to be significantly smaller than the value in the closed state. If taking the contact force $F_2$ as the characteristic force, the second predetermined force value V2 can be set even close to zero.

Once the first item $a_i$ in the first array F has been identified in which the value of the item $a_i$ is at or below the second predetermined force value V2, go to a step 520, determining the time point $t_i$ in the second array T corresponding to the identified item $a_i$ from the first array F as the time point $t_{opening}$ of the opening of the circuit breaker. The first large magnitude variation of the characteristic force since the starting point can reflect the first separation of the movable contact from the stationary contact. As such, the opening time point is found.

Figure 6:
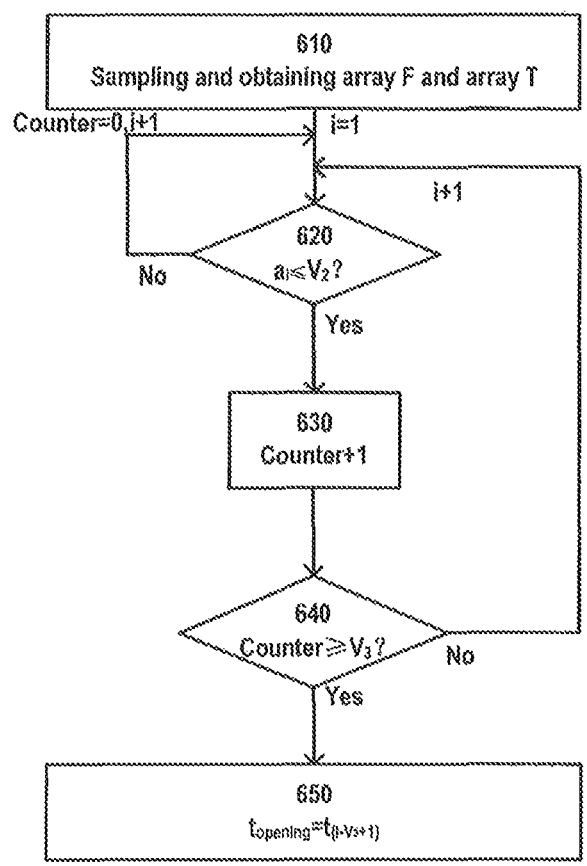
FIG. 6 illustrates the flow chart of a method for monitoring the time point of opening of a circuit breaker according to an embodiment of the present invention.

FIG. 6 illustrates the flow chart of a method for monitoring the time point of opening of a circuit breaker according to an embodiment of the present invention. In this method, the step 610 of sampling values of the characteristic force and obtaining array an first array F [$a_1, a_2, \ldots a_i, \ldots a_n$] and a second array T [$t_1, t_2, \ldots t_i, \ldots t_n$] is taken in the same way as the sampling and obtaining step 510 in the opening monitoring method as illustrated in FIG. 5. The comparison step 620 and circulating the step 620 is similar to the comparison and circulating step 520 in FIG. 5. The difference is that a Counter is provided to accumulate 630 the times that $a_i$ is at or below the second predetermined value V2. In another hand, once $a_i$ does not meet the condition that $a_i$ is at or below the second predetermined value V2, the Counter would be reset to zero. After the Counter accumulates one time, judging 640 whether the number of the Counter is equal to or larger than a predetermined number V3, for example 20. If no, circulating the step 620 for the next $a_i$ in the first array F; if yes, determining the time point to $t_{(i-v3+1)}$ in the second array T as the time point $t_{opening}$ of the opening of the circuit breaker, wherein the time point $t_{(i-v3+1)}$ represents the moment from which there are V3 number of continuous items in the first array F for the first time since the starting point, wherein each of the V3 number of continuous items is at or below the second predetermined value V2.

This method as illustrated in FIG. 6 ensures that from the determined opening time point, the characteristic force is maintained in a mall value equal to or smaller than the second predetermined value V2 for at least a while, without any bounce. As such, the determined opening time point can be considered as the actual opening time point, after that there would not be any contact between the movable and stationary contacts due to the bounce of the movable contact, which means the movable contact has reached a stable opened state.

Figure 7:
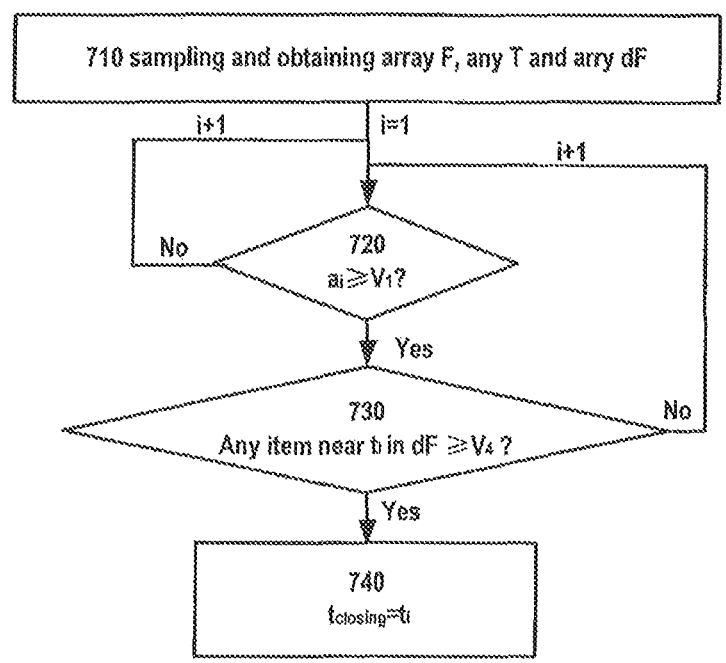
FIG. 7 illustrates the flow chart of a method for monitoring the time point of closing of a circuit breaker according to an embodiment of the present invention.

FIG. 7 illustrates the flow chart of a method for monitoring the time point of closing of a circuit breaker according to an embodiment of the present invention. In this method, the step 710 of sampling values of the characteristic force and obtaining an first array F $[a_1, a_2, \ldots a_i, \ldots a_n]$ and a second array T $[t_1, t_2, \ldots t_i, \ldots t_n]$ is taken in the similar way as the sampling and obtaining step 410 in the closing monitoring method as illustrated in FIG. 4. The difference is that the obtaining step 710 further obtains a third array dF $[(a_2-a_1)/(t_2-t_1), (a_3-a_2)/(t_3-t_2), \ldots (a_n-a_{n-1})/(t_i-t_{i-1}), \ldots (a_n-a_{n-1})/(t_n-t_{n-1})]$ representing the rate of force variation, in which each item refers to the force change rate during the adjacent two samplings. The comparison step 720 and circulating the step 720 is similar to the comparison and circulating step 420 in FIG. 4.

Once an item $a_i$ meets the condition that the value of the item $a_i$ reaches or exceeds a first predetermined force value V1 in step 720, go to a step 730 to compare the force change rate in the third array dF with a first predetermined force change rate value V4. The step 730 per se is a circulation. Several items from the third array dF are selected to perform the circulation 730. The selection for the several items is based on a corresponding item $((a_i-a_{i-1})/(t_i-t_{i-1}))$ in the third array dF which refers to the force change rate at the time point when the identified item $a_i$ in the first array F is sampled. The selected several items may comprises the corresponding item $((a_i-a_{j-1})/(t_j-t_{j-1}))$, several continuous items adjacent to and ahead of the corresponding item $((a_i-a_{j-1})/(t_i-t_{j-1}))$, such as 5 items, and several continuous items adjacent to and following the corresponding item $((a_i-a_{j-1})/(t_i-t_{j-1}))$, such as 5 items. In step 730, in any order, the selected several items in the third array dF are respectively compared with the first predetermined force change rate value V4 to judge if there is at least one item which value reaches or exceeds the first predetermined force change rate value V4. This step 730 is used to judge if there is a force variation near the time point when a large magnitude of the characteristic force is sampled for the first time. The first predetermined force change rate value V4 can be set depending on the sampling interval and the selected characteristic force. If taking the contact force $F_2$ as the characteristic force, the first predetermined force change rate value V4 can be set between 3000N/ms-7000N/ms.

If no any item in the selected several items meet the condition in step 730, which means there is no force variation, go back to the step 720 to find the next item a; in the first array F which meets the condition in the step 720.

If there is at least one item in the selected several items meet the condition in step 730 for the current identified item $a_i$ in the first array F, go to a step 740, determining the time point $t_i$ in the second array T corresponding to the identified item a; from the first array F as the time point $t_{closing}$ of the closing of the circuit breaker. As such, the closing time point is found.

Figure 8:
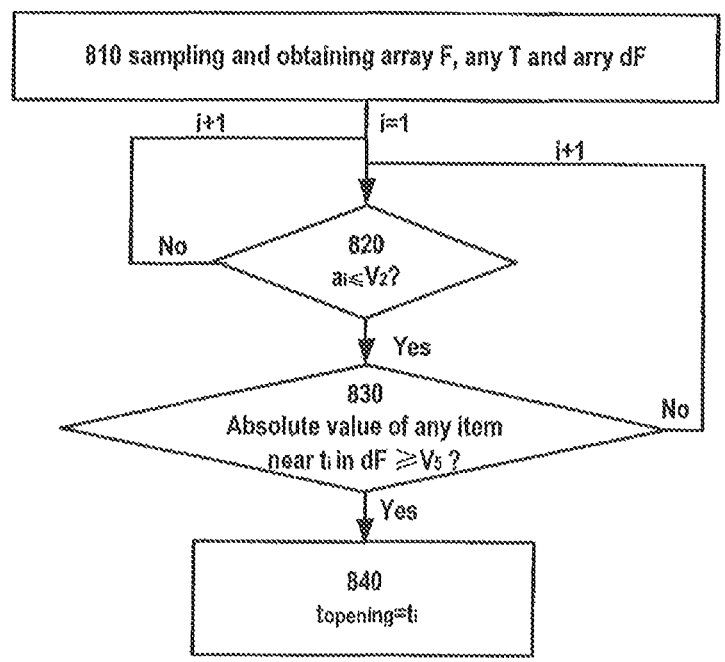
FIG. 8 illustrates the flow chart of a method for monitoring the time point of opening of a circuit breaker according to an embodiment of the present invention.

FIG. 8 illustrates the flow chart of a method for monitoring the time point of opening of a circuit breaker according to an embodiment of the present invention. In this method, the step 810 of sampling values of the characteristic force and obtaining an first array F $[a_1, a_2, \ldots a_i, \ldots a_n]$, a second array T $[t_1, t_2, \ldots t_i, \ldots t_n]$ and a third array dF $[(a_2-a_1)/(t_2-t_1), (a_3-a_2)/(t_3-t_2), \ldots (a_i-a_{j-1})/(t_i-t_{i-1}), \ldots (a_n-a_{n-1})/(t_n-t_{n-1})]$ is taken in the similar way as the sampling and obtaining step 710 in the closing monitoring method as illustrated in FIG. 7. The mere difference is the starting point for sampling is usually the time point when the opening instruction is sent from a control circuit. The comparison step 820 and circulating the step 820 is similar to the comparison and circulating step 720 in FIG. 7. The difference is the condition for judging is instead that whether the value of $a_i$ is at or below the second predetermined force value V2.

Once an item $a_i$ meets the condition that the value of the item $a_i$ is at or below a second predetermined force value V2 in step 820, go to a step 830 to compare the force change rate in the third array dF with a second predetermined force change rate value V5. The step 830 per se is also a circulation which is similar to the step 730 in FIG. 7. The method for selecting the several items from the third array dF is the same as in the step 730 in FIG. 7. The difference lies on the judging condition for step 830. In step 830, in any order, the absolute values of the selected several items in the third array dF are respectively compared with the second predetermined force change rate value V5 to judge if there is at least one item which absolute value reaches or exceeds the second predetermined force change rate value V5. Since the force variation during the opening period of the circuit breaker would be from a high value to a low value, the value of the item $(a_i-a_{i-1})/(t_j-t_{j-1})$ in the third array dF would be a negative value at the time point near the actual opening time point. Therefore, an absolute value of the corresponding item in the third array dF would be advantageous to be compared with the second predetermined force change rate value V5. In this regard, the second predetermined force change rate value V5 should be set as a positive value, such as between 3000N/ms-7000N/ms, similar to the first predetermined force change rate value V4.

Like in the method of FIG. 7, if no any item in the selected several items meet the condition in step 830, which means there is no free variation, go back to the step 820 to find the next item $a_i$ in the first array F which meets the condition in the step 820.

If there is at least one item in the selected several items meet the condition in step 830 for the current identified item $a_i$ in the first array F, go to a step 840, determining the time point $t_i$ in the second array T corresponding to the identified item $a_i$ from the first array F as the time point $t_{opening}$ of the opening of the circuit breaker. As such, the opening time point is found.

In the above embodiments, the sampled values are evaluated in many ways one by one in sequence based on the threshold of the magnitude and/or the rate of force variation of the characteristic force, so as to identify the force variation. However, other ways for identifying the force variation by means of the threshold of the magnitude and/or the rate of force variation of the characteristic force can also be used. The steps in the methods as discussed above are suitable to be performed by electrical circuits or computer programs, including the computing, recording, comparing, circulating steps and so on.

Figure 9:
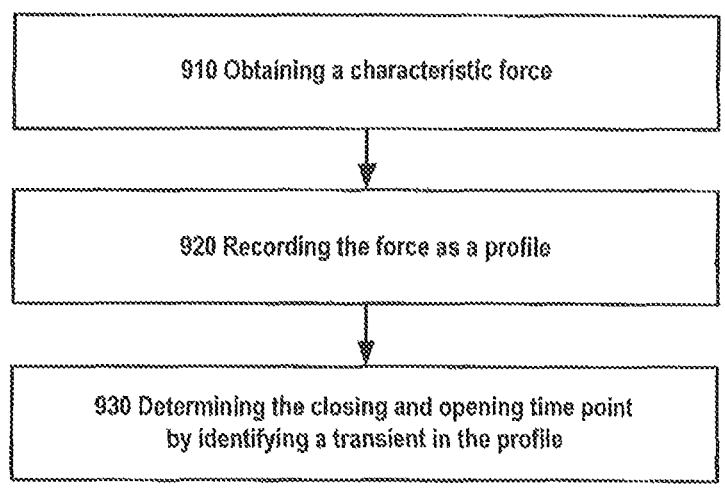
FIG. 9 illustrates the flow chart of a method for monitoring the time point of closing and opening of a circuit breaker according to another embodiment of the present invention.
Figure 10:
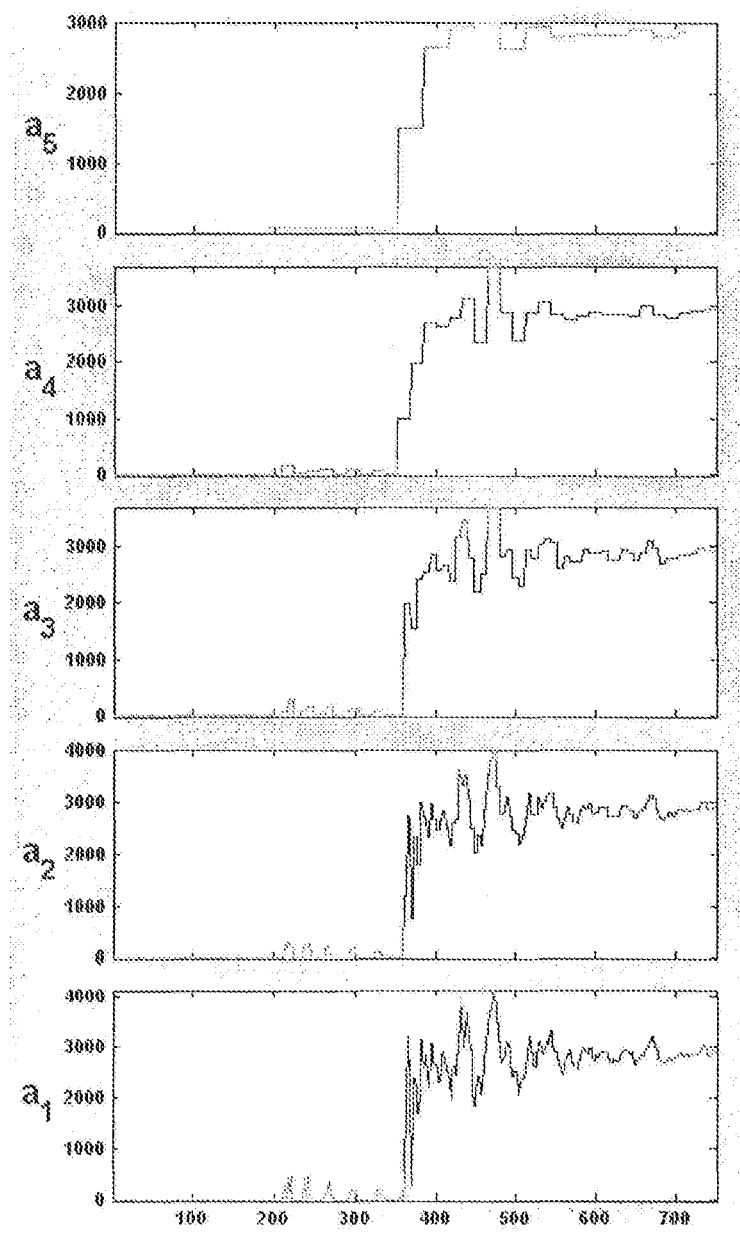
FIG. 10 depicts an original profile and the processed profiles of the characteristic force over the time.

FIG. 9 illustrates the flow chart of a method for monitoring the time point of closing and opening of a circuit breaker according to another embodiment of the present invention. In this method, a characteristic force is obtained 910 in the same way as in the above embodiments, for example, sampling a number of values of the characteristic force during the closing or opening period in a certain sampling interval. Different from the above embodiments, in this embodiment, the sampled values are not recorded as arrays. Instead, the obtained values of the characteristic force are recorded 920 over the time as a profile (see the profile a1 in FIG. 10, showing the recorded profile for the closing duration). The profile can be made by executable program or known software, such as Matlab software. Then the profile can be analyzed by executable program or known software, such as Matlab software, to automatically identify 930 the first variation of the characterized force over the time. The program or software can scan the profile since the starting point, and identify the first variation in the profile according to the character in the profile. For example, the program or software can analyze the slope of each section of the profile to identify whether there is a variation. Once a variation is identified in the profile for the first time since the starting point, the time point (the X coordinate in the profile) corresponding to the variation point is determined as the time point of closing or opening of the circuit breaker.

In one embodiment, before identifying the variation point in the profile, the recorded profile is proceeded with a mathematic method, for example by a program or known software, so as to make the variation point in the profile more obvious to be identified. For example, the profile can be processed with wavelet transforming. Profiles a2-a5 in FIG. 10 depict the processed profile for the original profile a1 with different wavelet transformations. It can be seen that the profile a5, which is wavelet transformed with Haar function, has been processed as square waves, wherein the noise and interference in the original profile can be filtered. The leading edge of the first square wave can be most clearly identified by the program or software as the first variation point. As such, the time point corresponding to the leading edge of the first square wave is determined as the time point of closing of the circuit breaker. It is appreciated that other mathematical methods or signal processing methods can also be used to process the profile so as to filter the noise and facilitate the identifying of the variation point in the profile.

For all the embodiments of the present invention as described, the accurate time point of closing or opening of the circuit breaker can be determined by sensing the characteristic forces related to the contact force F2 at a position away from the movable contact. As a result, the sensing electronics and the sensing process would not be impacted by the severe environment near the movable contact, if the circuit breaker is in normal operation. Therefore, the method according to the embodiments of the present invention can be used to on-line monitor the circuit breaker, without the need of a safe testing environment. The on-line monitoring can reflect the practical operating performance of the circuit breaker. Compared to the monitoring in the off-line environment or testing environment, the on-line monitoring is more useful for the user to study the performance of the circuit breaker. In addition, since the on-line monitoring does not need to interrupt the normal operation of the circuit breaker, the monitoring can be taken regularly for a long time, which is advantageous for the maintenance of the circuit breaker.

Based on the accurate determination of the closing and opening time point of the circuit breaker, other mechanical characters of the circuit breaker can also be computed or evaluated. For example, the speed of closing and opening of the circuit breaker can be computed based on the starting point for sending the instruction and the determined closing or opening time point. In addition, the contact opening gap and the contact spring stroke of the circuit breaker can also be obtained based on the closing and opening time point. Therefore, the methods according to the embodiments of the present invention provide a basis for the accurate monitoring to the mechanical characters of the circuit breaker.

The present invention further provides a device for monitoring a circuit breaker. The circuit breaker comprises an actuating mechanism for actuating the closing and opening of a movable contact of the circuit breaker. The device comprises: means for obtaining a characteristic force associated with the actuating mechanism over the time; and means for determining the time point when the closing and/or opening of the circuit breaker occurs by identifying a variation of the force. The device is adapted to implement the method according to any of the mentioned above.

It is also appreciated that the methods and device according to the embodiments of the present invention are also adapted for various kinds of circuit breakers, including the circuit breakers for high, medium and low voltage level, the circuit breakers with different actuating mechanisms.

Moreover, the methods and device according to the embodiments of the present invention may be implemented in various manners, including software, hardware, firmware, or any random combination thereof. For example, in some embodiments, the obtaining means and the determining means may be implemented by software and/or firmware. Alternatively or additionally, the obtaining means and the determining means may be partially or completely implemented based on hardware. For example, the obtaining means and the determining means may be implemented as an integrated circuit (IC) chip, an application-specific integrated circuit (ASIC), a system on chip (SOC), a field programmable gate array (FPGA), etc. The scope of the present invention is not limited in this aspect. In particular, in some embodiments, the obtaining means and the determining means may be implemented as a plug-in deployed at a monitoring device, as a component as a part of the monitoring device, or as an independent device working in coordination with an existed monitoring device in other manners.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein By studying the drawings, the disclosure of the embodiments of the present disclosure, and the attached Claims, those skilled in the art may understand and implement other modifications of the disclosed embodiments during the implementation of the present disclosure. In the claims, "comprising" does not exclude other elements or steps, and "a" or "one" does not exclude the plural concept. The simple fact of illustrating specific elements in the dependent claims, which are mutually different from each other, does not indicate that the combination of these elements cannot be used advantageously. The labels in drawings of the claims should not be interpreted as limiting the scopes thereof.

Though the present disclosure has been described with reference to the currently considered embodiments, it should be appreciated that the present disclosure is not limited the disclosed embodiments. On the contrary, the present disclosure is intended to cover various modifications and equivalent arrangements falling within in the spirit and scope of the appended claims. The scope of the appended claims is accorded with broadest explanations and covers all such modifications and equivalent structures and functions.

What is claimed is:

1. A method for monitoring a circuit breaker comprising an actuating mechanism for actuating the closing and opening of a movable contact of the circuit breaker; the method comprising the following steps:
   obtaining a characteristic force associated with the actuating mechanism over the time; and
   determining the time point when the closing and/or opening of the circuit breaker occurs by identifying a variation of the force;
   wherein the step of determining further comprises determining the moment when a variation increase of the characteristic force occurs as the time point of the closing of the circuit breaker; and determining the moment when a variation decrease of the characteristic force occurs as the time point of the opening of the circuit breaker; and
   wherein the variation of the characteristic force is identified based on a magnitude of the force and a rate of force variation.

2. The method according to claim 1, wherein the characteristic force is any of the followings:
   a contact force which is directly applied on a linkage mechanism of the actuating mechanism by a movable contact of the circuit breaker;
   an internal force subjected by any rod of a linkage mechanism of a actuating mechanism;
   a resultant force subjected by either end of any rod of the linkage mechanism;
   a component of the resultant force subjected by either end of any rod of the linkage mechanism, which component is in the direction of the contact force;
   a component of the resultant force subjected by either end of any rod of the linkage mechanism, which component is perpendicular to the direction of the contact force;
   a resultant force subjected by any pivot point for the linkage mechanism;
   a component of the resultant force subjected by any pivot point for the linkage mechanism, which component is in the direction of the contact force;
   a component of the resultant force subjected by any pivot point for the linkage mechanism, which component is perpendicular to the direction of the contact force.

3. The method according to claim 1, wherein the step of obtaining comprises computing a contact force which is directly applied on a linkage mechanism of the actuating mechanism by a movable contact of the circuit breaker, by a sensed force associated with the actuating mechanism;
   wherein the determining step comprises determining the time point when the closing and/or opening of the circuit breaker occurs by identifying a variation of the computed contact force.

4. The method according to claim 3, wherein the contact force is computed by the sensed force which is sensed at any pivot point of the linkage mechanism.

5. The method according to claim 1, wherein the step of obtaining comprising:
sampling a number of values of the characteristic force at different time points from a starting point, and obtaining a first array F $[a_1, a_2, \ldots a_i, \ldots a_n]$ representing the values of the characteristic force at the sampling time points, and a second array T $[t_1, t_2, \ldots t_i, \ldots t_n]$ representing the corresponding sampling time points, wherein "$a_i$" is the value of the sampled characteristic force for the i time sampling, "n" is the number of the sampling, "$t_i$" is the time point for the i time sampling.

6. The method according to claim 5, wherein the determining step comprising identifying an item ($a_i$) from the first item in the first array F which value reaches or exceeds a first predetermined force value (V1) for the first time, and determining the time point ($t_i$) in the second array T corresponding to the identified item ($a_i$) from the first array F as the time point of the closing of the circuit breaker.

7. The method according to claim 5, wherein the determining step comprising identifying an item ($a_i$) from the first item in the first array F which value is at or below a second predetermined force value (V2) for the first time, and determining the time point ($t_i$) in the second array T corresponding to the identified item ($a_i$) from the first array F as the time point of the opening of the circuit breaker.

8. The method according to claim 5, wherein the determining step comprising identifying an item ($a_i$) from the first item in the first array F which meets the following condition for the first time:
   there are just a predetermined number ($V_3$) of continuous items from a preceding item to the identified item ($a_i$) in the first array F, wherein each of the continuous items has a value at or below a second predetermined force value (V2);
   and then determining the time point ($t_{i-v3+1}$) in the second array T corresponding to the first item of the predetermined number ($V_3$) of continuous items in the first array F as the time point of the opening of the circuit breaker.

9. The method according to claim 5, wherein the step of obtaining further comprising computing and obtaining a third array dF $[(a_2-a_1)/(t_2-t_1), (a_3-a_2)/(t_3-t_2), \ldots (a_i-a_{i-1})/(t_i-t_{i-1}), \ldots (a_n-a_{n-1})/(t_n-t_{n-1})]$ representing the rate of force variation, in which each item refers to the force variation rate during the adjacent two samplings.

10. The method according to claim 9, wherein the determining step comprising:
    identifying an item ($a_i$) from the first item in the first array F which meets the following both conditions for the first time:
       the value of the identified item ($a_i$) reaches or exceeds a first predetermined force value (V1);
       among the several items in the third array dF which are at or close to a corresponding item $((a_i-a_{i-1})/(t_i-t_{i-1}))$ in the third array dF, there is an item $((a_j-a_{j-1})/(t_j-t_{j-1}))$ which value reaches or exceeds a first predetermined force change rate value (V4), wherein the corresponding item $((a_i-a_{i-1})/(t_i-t_{i-1}))$ in the third array dF refers to the force change rate at the time point when the identified item ($a_i$) in the first array F is sampled;
    and then determining the time point ($t_i$) in the second array T corresponding to the identified item ($a_i$) from the first array F as the time point of the closing of the circuit breaker.

11. The method according to claim 9, wherein the determining step comprising:

identifying an item ($a_i$) from the first item in the first array F which meets the following both conditions for the first time:

the value of the identified item ($a_i$) is at or below a second predetermined force value (V2);

among the several items in the third array dF which are at or close to a corresponding item (($a_i-a_{i-1}$)/($t_i-t_{i-1}$)) in the third array dF, there is an item (($a_j-a_{j-1}$)/($t_j-t_{j-1}$)) which absolute value reaches or exceeds a second predetermined force change rate value (V5), wherein the corresponding item (($a_i-a_{i-1}$)/($t_i-t_{i-1}$)) in the third array dF refers to the force change rate at the time point when the identified item ($a_i$) in the first array F is sampled;

and then determining the time point ($t_i$) in the second array T corresponding to the identified item ($a_i$) from the first array F as the time point of the opening of the circuit breaker.

12. The method according to claim 1, wherein the step of obtaining comprises obtaining a profile of the value of the characteristic force over the time; and the step of determining comprises determining the time point when the closing and/or opening of the circuit breaker occurs by identifying a variation in the profile.

13. The method according to claim 12, wherein the step of determining comprises processing the profile with wavelet transforming, and determining the time point when the closing and/or opening of the circuit breaker occurs by identifying a variation in the processed profile.

14. The method according to claim 13, wherein the wavelet transforming is based on the Haar function.

15. The method according to claim 2, wherein the step of obtaining comprises computing a contact force which is directly applied on a linkage mechanism of the actuating mechanism by a movable contact of the circuit breaker, by a sensored force associated with the actuating mechanism;

wherein the determining step comprises determining the time point when the closing and/or opening of the circuit breaker occurs by identifying a variation of the computed contact force.

16. A device for monitoring a circuit breaker, wherein the circuit breaker comprising an actuating mechanism for actuating the closing and opening of a movable contact of the circuit breaker; the device comprising:

means for obtaining a characteristic force associated with the actuating mechanism over the time; and means for determining the time point when the closing and/or opening of the circuit breaker occurs by identifying a variation of the force;

wherein the means for determining is further configured to determine the moment when a variation increase of the characteristic force occurs as the time point of the closing of the circuit breaker, and determine the moment when a variation decrease of the characteristic force occurs as the time point of the opening of the circuit breaker; and wherein the variation of the characteristic force is identified based on a magnitude of the force and a rate of force variation.

* * * * *